United States Patent [19]

Gedrat et al.

[11] 4,285,991
[45] Aug. 25, 1981

[54] METHOD FOR PRODUCING PRINTED CIRCUITS

[75] Inventors: Klaus Gedrat; Hans-Jürgen Ehrich; Hartmut Mahlkow; Joachim Wolff, all of Berlin, Fed. Rep. of Germany

[73] Assignee: Schering AG, Berlin and Bergkamen, Fed. Rep. of Germany

[21] Appl. No.: 150,174

[22] Filed: May 15, 1980

[30] Foreign Application Priority Data

May 21, 1979 [DE] Fed. Rep. of Germany ....... 2920940

[51] Int. Cl.$^3$ ............................ B05D 5/12; C23F 1/02
[52] U.S. Cl. .................................. 427/97; 156/659.1; 156/902; 29/852; 427/98
[58] Field of Search ................... 427/96, 97, 405, 98, 427/430 A, 436, 437, 438; 174/68.5; 29/846, 852; 204/15, 24, 32 R; 156/659.1, 902; 430/312, 313, 314, 316, 318, 319, 323

[56] References Cited

U.S. PATENT DOCUMENTS

| 3,672,986 | 6/1972 | Schneble et al. ................. 427/97 X |
| 3,675,318 | 7/1972 | Merkenschlager .................... 29/852 |
| 3,930,963 | 1/1976 | Polichette et al. ................ 427/97 X |

*Primary Examiner*—William A. Powell
*Attorney, Agent, or Firm*—Michael J. Striker

[57] ABSTRACT

A method for producing printed circuits. An epoxy resin reinforced with glass fiber is used as basis material, coated with copper, drilled and activated. In one embodiment, the circuit diagram is applied after covering the non-desired regions with a resistance, by screen or photo printing. A nickel, cobalt, or nickel-cobalt layer is deposited onto the circuit, the circuit is covered with a solder prevention lacquer, then the eyes and bore holes are covered with copper. Alternatively, after pre-treatment and activation, all areas except the soldering eyes and bore holes are covered with resist, a nickel, cobalt. or nickel-cobalt layer is applied, the circuit diagram is printed using a resist, and the eyes and bore hole are treated as above.

17 Claims, No Drawings

METHOD FOR PRODUCING PRINTED CIRCUITS

BACKGROUND OF THE INVENTION

The invention relates to a method for producing printed circuits by using basis material coated with copper, which basis material is drilled, purified, activated, possibly reduced in known manner and after-treated in known manner wherein the circuit diagram is applied, possibly after covering of the non-desired regions by a resist, through screen printing or photo printing.

Methods for producing printed circuits are already known, however they have certain disadvantages.

One disadvantage of the so-called subtractive technique is that large amounts of the coating of the basis material must be removed after the build-up of the conductor image. Simultaneously, the etching of the conductors leads to the known damages which are the more grave and percentage increase more rapidly the smaller the lanes are dimensioned or approached to each other, respectively. These phenomena thus contradict a further miniaturizing in the field of the subtractive technique.

A disadvantage of the so-called additive technique is the fact that the basis material must be coated with adhesives. After chemical treatment and activating, the adhesive is the basis for the selectively applied and chemically extracted copper and has clearly worse electrical characteristics in comparison with epoxy resin after the wet treatment, thereby limiting the dimension of miniaturized circuits.

SUMMARY OF THE INVENTION

Accordingly, it is the object of the present invention to create a method for producing printed circuits with thinnest possible conductors arranged on the smallest possible space and having optimum electrical characteristics without retaining disadvantages of the known methods.

This object is solved according to the invention by a method using basis material coated with copper which basis material is drilled, purified, activated, possibly reduced in a known manner and is pretreated in a known manner wherein the circuit diagram is applied possibly after covering of the non-desired regions by means of a resistance, by screen printing or photo printing which method is characterized in that the so-pretreated basis material is covered by a nickel, cobalt or nickel-cobalt layer through treatment with a chemical nickel, cobalt or nickel-cobalt bath which layer is preferably covered with a chemical and/or galvanic copper bath, that then the resistance is removed in a known manner, and that afterwards, provided that all regions not belonging to the conductor image have been covered by the resist, either (a) the exposed copper is etched, the circuit diagram is covered negatively thereon by means of a solder prevention lacquer wherein the soldering eyes and bore holes are not covered, that the eye and bore holes are provided with a copper layer by treatment with a chemical copper bath and if necessary a lead-tin alloy is applied in addition to the so-coppered soldering eyes and bore holes;

or (b) the circuit diagram is applied positively by means of a resist, then the copper is etched and the resist is removed in a known manner, then the circuit diagram is covered by a solder prevent lacquer wherein the soldering eyes and bore holes are not covered and are afterwards provided with a copper layer in a chemical copper bath wherein the so-coppered eyes and bore holes are coated in addition with a lead-tin alloy, if possible.

Special embodiments of this method are that as basis material an epoxy resin reinforced with glass fibers is used, that a chemical nickel bath is used containing as essential components a nickel salt, a citrate and an alkalihypophosphite, that a chemical nickel bath is used containing as essential components a nickel salt, an alkalidiphosphate, an alkali hydrogen phosphate and hydrazine or one of its derivates, that a chemical cobalt bath is used containing as essential components a cobalt salt, a citrate and an alkalihypophosphite, that a chemical cobalt bath is used containing as essential components a cobalt salt, an alkalidiphosphate, an alkali hydrogen phosphate and hydrazine or one of its derivates, that a chemical nickel-cobalt is used containing as essential components a nickel salt, a cobalt salt, a citrate and an alkalihypophosphite;

That the nickel, cobalt or nickel-cobalt layer is applied in a thickness of 1.1 to 1.5 $\mu$m, preferably of 0.3 to 0.8 $\mu$m;

That a stabilized chemical copper bath is used, that a chemical copper bath is used having as essential components a copper salt, a complex forming substance, formaldehyde acid, an alkalicyanide and if necessary a selenium compound as stabilizers.

The inventive method permits the producing of qualitatively high value miniaturizal circuits in a manner not reached so far. Moreover, the method has the advantage to permit the manufacture of finest conductor lanes in a width of under 100 $\mu$m having best values of resistance considering the insulation and surface upon starting from a basic material coated by copper.

A further essential advantage is the saving of copper which is a precious raw material.

As suitable basis material, for example phenol resin laminated paper, epoxy resin paper and especially epoxy resin reinforced with glass fibres are used.

This basis material is drilled, purified in known manner and is activated in one of the conventional activating systems, if necessary reduced and after-treated. Afterwards, it is rinsed and dried in known manner.

The circuit diagram is applied negatively or positively in the screening print or photo print.

It is also possible to apply the soldering image (soldering eyes and bore holes) negatively by a screening print or photo print. The lining with metal is obtained in a chemical bath with a nickel, cobalt or nickel-cobalt layer of 0.1 to 1.5 $\mu$m which layer is covering either the entire circuit image or only the soldering eyes and bore holes. These layers can be precoppered chemically and/or galvanically in a conventional bath. After removing of the previously applied resist, which removal is obtained in a known manner by influence of an organic solvent like, for example methylene chloride, the exposed copper is etched in a known manner while the copper located under the nickel, cobalt or nickel-cobalt layer as well as the metal layer itself remain surprisingly unattacked especially upon use of alkaline etching substances. As resist, a conventional photo varnish or photo film is suitably used. In many ases, the developed circuit image is covered negatively by solder prevention lacquer and the exposed soldering eyes and bore holes are chemically coppered.

As copper bath, a stabilized chemical copper bath is preferably used which contains as essential components a copper salt, a complex forming substance, formaldehyde, an alkali cyanide and if necessary a selenium compound as stabilizer.

As alkali cyanide, especially sodium cyanide is suitable in concentrations of 15 to 30 mg/liter.

As suitable selenium compounds, the organic, inorganic or organic-inorganic mono- and diselenide and especially the alkaliselenocyanate like potassium selenocyanate are used, in small concentrations of especially 0.1 to to 0.3 mg/liter.

The novel features which are considered as characteristic for the invention are set forth in particular in the appended claims. The invention itself, however, both as to its construction and its method of operation, together with additional objects and advantages thereof, will be best understood from the following description of specific embodiments.

DESCRIPTION OF THE PREFERRED EMBODIMENTS

The following examples serve for explanation of the invention.

EXAMPLE 1

A conventional basis plate coated with copper on both sides, of epoxy resin reinforced with glass fibers, is drilled, brushed in a known manner and etched and purified by using a stabilized sulphate solution of hydrogen peroxide. Afterwards, the so-pretreated plate is activated with an activator on the basis of, for example palladium chloride, tin chloride and hydrochloric acid which is adhered thereon with a 30% fluoroboric acid. Then all areas not belonging to the conductor image are covered by a resist that means negatively printed and the occurring contaminations are removed.

According to the invention, a chemical nickel bath of the following composition is exposed thereto.
28 g/liter nickel sulphate $NiSO_4.7H_2O$
20 g/liter sodium hypophosphite $NaH_2PO_2.H_2O$
20 g/liter sodium borate $Na_2B_4O_7.10H_2O$
75 g/liter trisodium citrate $Na_3C_4H_3O_6.2H_2O$ The treatment occurs upon a pH value of 9 at 50° C. for a duration of 30 minutes. The thickness of the layer is approximately 1.5 $\mu m$.

Afterwards, the resist is removed for example by using an organic solvent like methylene chloride and the exposed copper is etched by an acid etching solution, for example an acid ammonium persulfate solution or an alkaline etching solution, for example an ammoniacal solution of sodium chlorite.

Then a soldering mask is applied by using a solder prevention lacquer, for example on the basis of epoxy resin having polyisocyanates and amines as hardener, which lacquer is again covering negatively the circuit image but exposing the soldering eyes and bore holes.

The soldering eyes are bore holes are then coppered through treatment with a chemical copper bath of the following composition:
10 g/liter copper sulfate $CuSO_4.5H_2O$
30 g/liter ethylene diamine tetra-acetic acid
20 g/liter sodium hydroxide $NaOH$
0.025 g/liter sodium cyanide $NaCN$
0.001 g/liter potassium selenocyanate $KSeCN$
4 ml formaldehyde 37%

The coppering occurs upon a temperature of 65° C. for a duration of treatment of 20 hours having an average separation speed of 1.5 $\mu m$/hour.

A conductor image is obtained having conductors of a layer thickness of approximately 30 $\mu m$.

If desired, the copper layer on the soldering eyes and bore hole walls can be protected by a hot air tinning, that means applying of a liquid lead-tin alloy.

The printed circuit is prepared for subsequent line-up and soldering.

EXAMPLE 2

A conventional basis plate coated by copper on both sides and of epoxy resin reinforced by glass fibers is drilled and brushed in a known manner and etched and purified by using a stabilized sulfate solution of hydrogen peroxide. Then, the so-pretreated plate is activated with an activator on the basis of for example palladium chloride, tin chloride and hydrochloric acid and adhered thereto with 30% fluoroboric acid. Afterwards, all areas except the soldering eyes and bore holes are covered by a resist, that is negatively printed and the obtained contaminations are removed. According to the invention, a chemical nickel bath of the following composition is exposed thereto:
15 g/liter nickel sulfate $NiSO_4.7H_2O$
20 g/liter hydrazine hydrate $N_2H_2.H_2O$ 80%
80 g/liter sodium diphosphate $Na_4P_2O_7.1pH_2O$
30 g/liter potassium hydrogen phosphate The treatment occurs upon a pH value of 11.5 at 60° C. and for a duration of 30 minutes. Layer thickness is 1 $\mu m$.

Then, the resist is removed for example by using an organic solvent like methylene chloride.

Then, the circuit image is positively printed by using a resist, then the copper is etched like in Example 1 as well as the resist as above mentioned, then the circuit image is covered by a solder prevention lacquer exposing the soldering eyes and bore holes which are coppered upon use of the chemical copper bath in the composition described in Example 1 and the soldering eyes and bore hole walls are protected by a hot air tinning with a lead-tin layer if desired. A conductor image is obtained having optimum electric characteristics of at least $1 \times 10^{12}$ ohm.

EXAMPLE 3

A conventional basis plate of epoxy resin coated on both sides with copper and being reinforced by glass fibers is drilled in a known manner and etched and purified by a stabilized sulfate solution of hydrogen peroxide. Then the plate is activated through treatment with an aqueous alkaline solution of a palladium complex like, for example palladium sulfate in 2-aminopyridine which complex is then reduced through exposing to a reducing substance like, for example sodium diethylaminoborane.

Through exposing to a chemical nickel bath having the following composition, a nickel plating of the plate surface and of the bore hole walls is obtained:
20 g/liter nickel sulfate $NiSo_4.7H_2O$
20 g/liter sodium hypophosphite $NaHPO_2.H_2O$
30 g/liter succinic acid $HOOC(CH_2)_2.COOH$
20 g/liter sodium borate $Na_2B_4O_6.10H_2O$ The treatment is executed upon a pH value of 8.5 and with a temperature of 35° C. for 5 minutes. The obtained thickness of layer is 0.2 $\mu m$.

Then, the surface is positively printed with the circuit image as described in Example 2, the copper coating is etched, the resist is removed negatively with solder prevention lacquer upon exposing of the soldering eyes and bore holes, chemically coppered and, if desired, a tin-lead layer is applied. Also in this case a printed circuit is obtained having optimum electrical characteristics of at least $1 \times 10^{12}$ ohm.

EXAMPLE 4

A conventional basis plate of epoxy resin coated with copper on both sides and reinforced with glass fibers is drilled in known manner and is etched and purified by means of a stabilized sulfate solution of hydrogen peroxide. Then, the plate is activated through threatment with an aqueous alkaline solution of a palladium complex like, for example palladium sulfate in 2-aminopyridine which complex is reduced afterwards upon exposing to a reducing substance like, for example sodium diethylaminoborane.

Through exposing to a chemical cobalt bath having the following composition, a chemical separation of cobalt on the plate surface and the bore hole walls is obtained:

20 g/liter cobalt sulfate $CoSO_4 6H_2O$
20 g/liter sodium hypophosphite $NaHPO_2.H_2O$
30 g/liter succinic acid $HOOC (CH_2)_2.COOH$
20 g/liter sodium borate $Na_2B_4O_7.10H_2O$ The treatment is executed upon a pH value of 8.5 and at a temperature of 35° C. for 5 minutes. The obtained thickness of the layer is 0.2 μm.

Then, the surface is positively printed with the circuit image as described in Example 2, the copper coating is etched, the resist is removed negatively, with solder prevention lacquer upon exposing of the soldering eyes and bore holes chemically coppered and, if desired, a tin-lead layer is applied. In this case, too, a printed circuit is obtained having optimum electrical characteristics of at least $1 \times 10^{12}$ ohm.

It will be understood that each of the elements described above, or two or more together, may also find a useful application in other methods of applying printed circuits differing from the types described above.

While the invention has been illustrated and described as embodied in a method of applying printed circuits, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

We claim:

1. A method of producing printed circuits of the type wherein basis material is coated with copper which material is drilled, purified, activated, reduced and after-treated, wherein the circuit image is applied by printing the copper with a resist after covering of all areas not belonging to the circuit intended to be produced, wherein the improvement comprises covering the exposed copper of the so-pretreated basis material with a layer of metal selected from the group consisting of nickel, cobalt and nickel-cobalt through treatment with a chemical bath of said metal; removing the resist; etching the copper exposed by removal of the resist; covering the circuit image negatively with a solder prevention lacquer but leaving the soldering eyes and bore holes exposed; and providing the exposed eyes and bore holes with a copper layer though treatment with a chemical copper bath.

2. Method according to claim 1, wherein as basis material, an epoxy resin is used which is reinforced with glass fibers.

3. Method according to claim 1, wherein a chemical nickel bath is used containing as essential components a nickel salt, a citrate and an alkalihypophosphite.

4. Method according to claim 1, wherein a chemical nickel bath is used containing as essential components a nickel salt, an alkalidiphosphate, an alkali hydrogen phosphate and hydrazine or one of its derivates.

5. Method according to claim 1, wherein a chemical cobalt bath is used containing as essential components a cobalt salt, a citrate and an alkali-hypophosphite.

6. Method according to claim 1, wherein a chemical cobalt bath is used containing as essential components a cobalt salt, an alkalidiphosphate, an alkali hydrogen phosphate and hydrazine or one of its derivates.

7. Method according to claim 1, wherein a chemical nickel-cobalt bath is used containing as essential components a nickel salt, a cobalt salt, a citrate and an alkalihypophosphite.

8. Method according to claim 1, wherein the nickel, cobalt or nickel-cobalt layer is applied having a thickness of about 0.1 to 0.5 μm.

9. Method according to claim 1, wherein the nickel, cobalt or nickel-cobalt layer is applied having a thickness of about 0.3 to 0.8 μm.

10. Method according to claim 1, wherein a stabilized chemical copper bath is used.

11. Method according to claim 10, wherein a chemical copper bath is used containing as essential components a copper salt, a complex forming substance, formaldehyde as well as an alkalicyanide and if necessary a selenium compound as stabilizors.

12. Method according to claim 1, further comprising applying a lead-tin alloy onto the so-coppered soldering eyes and bore holes.

13. Method according to claim 1, further comprising coppering with a copper bath selected from the group consisting of chemical and galvanic copper baths after said covering with a layer of selected metal.

14. A method of producing printed circuits of the type wherein basis material is coated with copper which material is drilled, purified, activated, reduced and after-treated wherein the improvement comprises covering a portion of copper on the so-pretreated basis material with a layer of metal selected from the group consisting of nickel, cobalt and nickel-cobalt through treatment with a chemical bath of said metal; applying the circuit image positively by means of a resist onto the remaining exposed copper; etching the copper where it remains uncovered by said layer and the resist; removing the resist; covering the circuit image by means of a solder prevention lacquer while leaving the soldering eyes and bore holes uncovered; and providing the exposed eyes and bore holes with a copper layer in a chemical copper bath.

15. Method according to claim 14, further comprising covering all areas with resist except the soldering eyes and bore holes prior to said covering with a layer of selected metal and removing the resist after said covering with a layer of selected metal.

16. Method according to claim 14 further comprising applying a lead-tin alloy onto the so-coppered soldering eyes and bore holes.

17. Method according to claim 14, further comprising coppering with a copper bath selected from the group consisting of chemical and galvanic copper baths after said covering with a layer of selected metal.

* * * * *